US009581362B2

(12) United States Patent
Stanley et al.

(10) Patent No.: US 9,581,362 B2
(45) Date of Patent: Feb. 28, 2017

(54) HIGH-EFFICIENCY POWER CONVERSION ARCHITECTURE FOR DRIVING A THERMOELECTRIC COOLER IN ENERGY CONSCIOUS APPLICATIONS

(71) Applicant: Phononic Devices, Inc., Durham, NC (US)

(72) Inventors: Marshall Stanley, Chapel Hill, NC (US); Daniel Barus, Raleigh, NC (US); Ricardo E. Rodriguez, Raleigh, NC (US); Jesse W. Edwards, Wake Forest, NC (US); Robert Joseph Therrien, Cary, NC (US)

(73) Assignee: Phononic Devices, Inc., Durham, NC (US)

( * ) Notice: Subject to any disclaimer, the term of this patent is extended or adjusted under 35 U.S.C. 154(b) by 0 days.

(21) Appl. No.: 14/733,270

(22) Filed: Jun. 8, 2015

(65) Prior Publication Data

US 2015/0354866 A1    Dec. 10, 2015

Related U.S. Application Data

(60) Provisional application No. 62/008,803, filed on Jun. 6, 2014.

(51) Int. Cl.
*F25B 21/02* (2006.01)
*H01L 35/28* (2006.01)
(Continued)

(52) U.S. Cl.
CPC ......... *F25B 21/02* (2013.01); *G05D 23/1919* (2013.01); *H01L 35/28* (2013.01);
(Continued)

(58) Field of Classification Search
CPC .............. F25B 2321/0212; F25B 21/02; F25B 2700/21; F25B 2700/00; G05D 23/1919; G05D 23/2417; H01S 3/04; H01S 5/02415
(Continued)

(56) References Cited

U.S. PATENT DOCUMENTS 6,463,743 B1 * 10/2002 Laliberte ................. F25B 21/04
62/3.3
6,519,949 B1 * 2/2003 Wernlund et al. ............... 62/3.7
(Continued)

OTHER PUBLICATIONS

International Search Report and Written Opinion for International Patent Application No. PCT/US2015/034683, mailed Sep. 4, 2015, 13 pages.
(Continued)

*Primary Examiner* — Adolf Berhane
(74) *Attorney, Agent, or Firm* — Withrow & Terranova, PLLC

(57) ABSTRACT

Systems and methods are disclosed herein relating to an Alternating Current-Direct Current (AC-DC) power conversion system for supplying power to one or more Thermoelectric Coolers (TECs). In some embodiments, a system comprises one or more TECs and an AC-DC power conversion system configured to supply power to the one or more TECs for a high efficiency mode of operation and a high heat pumping mode of operation. The AC-DC power conversion system comprises a first AC-DC power converter configured to convert an AC input to a DC output at a first output power level for the high efficiency mode of operation of the one or more TECs. The AC-DC power conversion system further comprises a second AC-DC power converter configured to convert the AC input to a DC output at a second output power level for the high heat pumping mode of operation of the one or more TECs.

23 Claims, 10 Drawing Sheets

(51) Int. Cl.
*G05D 23/19* (2006.01)
*H02M 7/23* (2006.01)
*H02M 1/00* (2006.01)

(52) U.S. Cl.
CPC ...... *H02M 7/23* (2013.01); *H02M 2001/0048* (2013.01); *Y02B 70/1491* (2013.01)

(58) Field of Classification Search
USPC ... 62/3.2–3.3, 3.7; 363/34, 44, 84, 108, 123, 363/125, 65, 67
See application file for complete search history.

(56) References Cited

U.S. PATENT DOCUMENTS

| | | | |
|---|---|---|---|
| 6,981,381 B1* | 1/2006 | Wang et al. | 62/3.2 |
| 7,705,485 B2* | 4/2010 | Iwata | H04N 1/00885 307/38 |
| 2002/0090012 A1* | 7/2002 | Kroeger | 372/34 |
| 2006/0107989 A1* | 5/2006 | Bierschenk | H01L 35/32 136/212 |
| 2006/0117761 A1* | 6/2006 | Bormann | F25B 21/02 62/3.6 |
| 2006/0120120 A1 | 6/2006 | Lin et al. | |
| 2006/0124165 A1* | 6/2006 | Bierschenk | H01L 35/30 136/212 |
| 2007/0079616 A1* | 4/2007 | Deal | 62/3.7 |
| 2011/0241630 A1 | 10/2011 | Ritchey et al. | |
| 2013/0051097 A1 | 2/2013 | Katsumata et al. | |
| 2013/0051897 A1 | 2/2013 | Butland | |
| 2013/0139524 A1* | 6/2013 | Kim et al. | 62/3.7 |
| 2013/0291560 A1 | 11/2013 | Therrien et al. | |

OTHER PUBLICATIONS

Written Opinion for International Patent Application No. PCT/US2015/034683, mailed Jun. 3, 2016, 6 pages.
International Preliminary Report on Patentability for International Patent Application No. PCT/US2015/034683, mailed Sep. 15, 2016, 8 pages.

* cited by examiner

US 9,581,362 B2

HIGH-EFFICIENCY POWER CONVERSION ARCHITECTURE FOR DRIVING A THERMOELECTRIC COOLER IN ENERGY CONSCIOUS APPLICATIONS

RELATED APPLICATIONS

This application claims the benefit of provisional patent application Ser. No. 62/008,803, filed Jun. 6, 2014, the disclosure of which is hereby incorporated herein by reference in its entirety.

FIELD OF THE DISCLOSURE

The present disclosure relates to a high-efficiency power conversion architecture for driving a thermoelectric cooler.

BACKGROUND

Thermoelectric Coolers (TECs) are solid state semiconductor devices that utilize the Peltier effect to transfer heat from one side of the device to the other, thereby creating a cooling effect on the cold side of the device. One example of a thermoelectric cooling device 10 is illustrated in FIG. 1. Notably, as used herein, a thermoelectric cooling device consists of a single N-type leg and a single P-type leg (i.e., is a two-leg device), whereas a thermoelectric cooling module includes many thermoelectric cooling devices connected in series. As such, the general term "thermoelectric cooler" or TEC is used herein as referring to either thermoelectric cooling devices or thermoelectric cooling modules.

As illustrated in FIG. 1, the thermoelectric cooling device 10 includes an N-type leg 12, a P-type leg 14, a top conductive metal layer 16, and a bottom conductive metal layer 18. The N-type leg 12 and the P-type leg 14 are formed of a thermoelectric material (i.e., a semiconductor material having good thermoelectric properties). In order to effect thermoelectric cooling, an electrical current is applied to the thermoelectric cooling device 10 as shown. The direction of current transference in the N-type leg 12 and the P-type leg 14 is parallel to the direction of heat transference in the thermoelectric cooling device 10. As a result, cooling occurs at the top conductive metal layer 16 by absorbing heat at the top surface of the thermoelectric cooling device 10 and releasing heat at the bottom surface of the thermoelectric cooling device 10. One example of a thermoelectric module 20 is illustrated in FIG. 2. As illustrated, the thermoelectric module 20 includes multiple thermoelectric cooling devices 10 connected in series. These multiple thermoelectric cooling devices 10 are packaged within a single thermoelectric module 20.

While thermoelectric cooling devices 10 and thermoelectric cooling modules 20 have been used in various cooling applications, conventionally, they have not been used for refrigeration due to, among other things, poor efficiency as compared to that of vapor-compressors. Recently, there have been many advances in both thermoelectric materials and heat transfer systems based on thermoelectric cooling devices and modules. As a result of these advances along with the many benefits of thermoelectric refrigeration over conventional vapor-compression refrigeration, thermoelectric refrigeration is primed to challenge vapor-compression refrigeration in both residential and commercial applications.

However, there remains a need to further improve the efficiency of thermoelectric cooling devices and modules.

SUMMARY

Systems and methods are disclosed herein relating to an Alternating Current-Direct Current (AC-DC) power conversion system for supplying power to one or more Thermoelectric Coolers (TECs) in such a manner as to minimize or reduce total AC power draw. In some embodiments, a system comprises one or more TECs and an AC-DC power conversion system configured to supply power to the one or more TECs for a high efficiency mode of operation and a high heat pumping mode of operation. The AC-DC power conversion system comprises a first AC-DC power converter configured to convert an AC input to a DC output at a first output power level for the high efficiency mode of operation of the one or more TECs. The first output power level corresponds to a high Coefficient of Performance (COP) operation point of the one or more TECs. The first AC-DC power converter has, at the first output power level, an efficiency that is approximately equal to a maximum efficiency of the first AC-DC power converter. The AC-DC power conversion system further comprises a second AC-DC power converter configured to convert the AC input to a DC output at a second output power level for the high heat pumping mode of operation of the one or more TECs. The second output power level corresponds to a high heat pumping operation point of the one or more TECs. The second AC-DC power converter has, at the second output power level, an efficiency that is approximately equal to a maximum efficiency of the second AC-DC power converter. In this manner, a total AC draw of the system is reduced as compared to one that uses a conventional AC-DC power converter, particularly when operating the one or more TECs in the high efficiency mode of operation.

In some embodiments, the AC-DC power conversion system further comprises a switching fabric comprising a first input coupled to an output of the first AC-DC power converter, a second input coupled to an output of the second AC-DC power converter, and an output coupled to the one or more TECs.

In some embodiments, the AC-DC power conversion system further comprises a DC-DC converter having an input coupled to an output of the second AC-DC power converter and an output coupled to the second input of the switching fabric. In some embodiments, the system further comprises a controller configured to adaptively control the DC-DC converter when operating the one or more TECs in the high heat pumping mode of operation to adaptively adjust a power level provided to the one or more TECs within a predetermined high power level range. In some embodiments, the predetermined high power level range is a range of power levels that corresponds to a range of heat pumping energies within or including 30% to 100% of the maximum heat pumping ($Q_{max}$) of the one or more TECs.

In some embodiments, the AC-DC power conversion system further comprises a DC-DC converter having an input coupled to an output of the first AC-DC power converter and an output coupled to the first input of the switching fabric. In some embodiments, the system further comprises a controller configured to adaptively control the DC-DC converter when operating the one or more TECs in the high efficiency mode of operation to adaptively adjust a power level provided to the one or more TECs within a predetermined low power level range. In some embodiments, the predetermined low power level range is a range of power levels that corresponds to a range of COP values within or including 80% to 100% of the maximum COP ($COP_{max}$) for the one or more TECs.

In some embodiments, the system further comprises a controller configured to selectively control the switching fabric such that the one or more TECs are coupled to the output of first AC-DC power converter for the high efficiency mode of operation and coupled to the output of the second AC-DC power converter for the high heat pumping mode of operation. In some embodiments, the controller is further configured to enable the first AC-DC converter and disable the second AC-DC converter for the high efficiency mode of operation of the one or more TECs. In some embodiments, the controller is further configured to disable the first AC-DC converter and enable the second AC-DC converter for the high heat pumping mode of operation of the one or more TECs.

In some embodiments, the one or more TECs comprises a first set of TECs and a second set of TECs, each of the first set and second set of TECs comprising one or more TECs. Further, the AC-DC power conversion system further comprises a switching fabric comprising a first input coupled to an output of the first AC-DC power converter, a second input coupled to an output of the second AC-DC power converter, a first output coupled to the first set of TECs, and a second output coupled to the second set of TECs. The switching fabric is configured to independently couple the first and second sets of TECs to the first and second AC-DC power converters such that the first and second sets of TECs are independently operated in either the high efficiency mode of operation or the high heat pumping mode of operation.

In some embodiments, the high COP operation point is a maximum COP operation point and the high heat pumping operation point is a maximum heat pumping operation point.

In some embodiments, a method of controlling an AC-DC power conversion system to provide power to one or more TECs for a high efficiency mode of operation and a high heat pumping mode of operation is provided. The AC-DC power conversion system comprises a first AC-DC power converter configured to convert an AC input to a DC output at a first output power level for the high efficiency mode of operation of the one or more TECs and a second AC-DC power converter configured to convert the AC input to a DC output at a second output power level for the high heat pumping mode of operation of the one or more TECs, and the method comprises determining whether to operate the one or more TECs in the high efficiency mode of operation or the high heat pumping mode of operation. The method further comprises, upon determining to operate the one or more TECs in the high efficiency mode of operation, configuring the AC-DC power conversion system to couple an output of the first AC-DC power converter to the one or more TECs, the first output power level of the DC output of the first AC-DC power converter corresponding to a high COP operation point of the one or more TECs and the first AC-DC power converter having, at the first output power level, an efficiency that is approximately equal to a maximum efficiency of the first AC-DC power converter. The method further comprises, upon determining to operate the one or more TECs in the high heat pumping mode of operation, configuring the AC-DC power conversion system to couple an output of the second AC-DC power converter to the one or more TECs, the second output power level of the DC output of the second AC-DC power converter corresponding to a high heat pumping operation point of the one or more TECs and the second AC-DC power converter having, at the second output power level, an efficiency that is approximately equal to a maximum efficiency of the second AC-DC power converter.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 4:
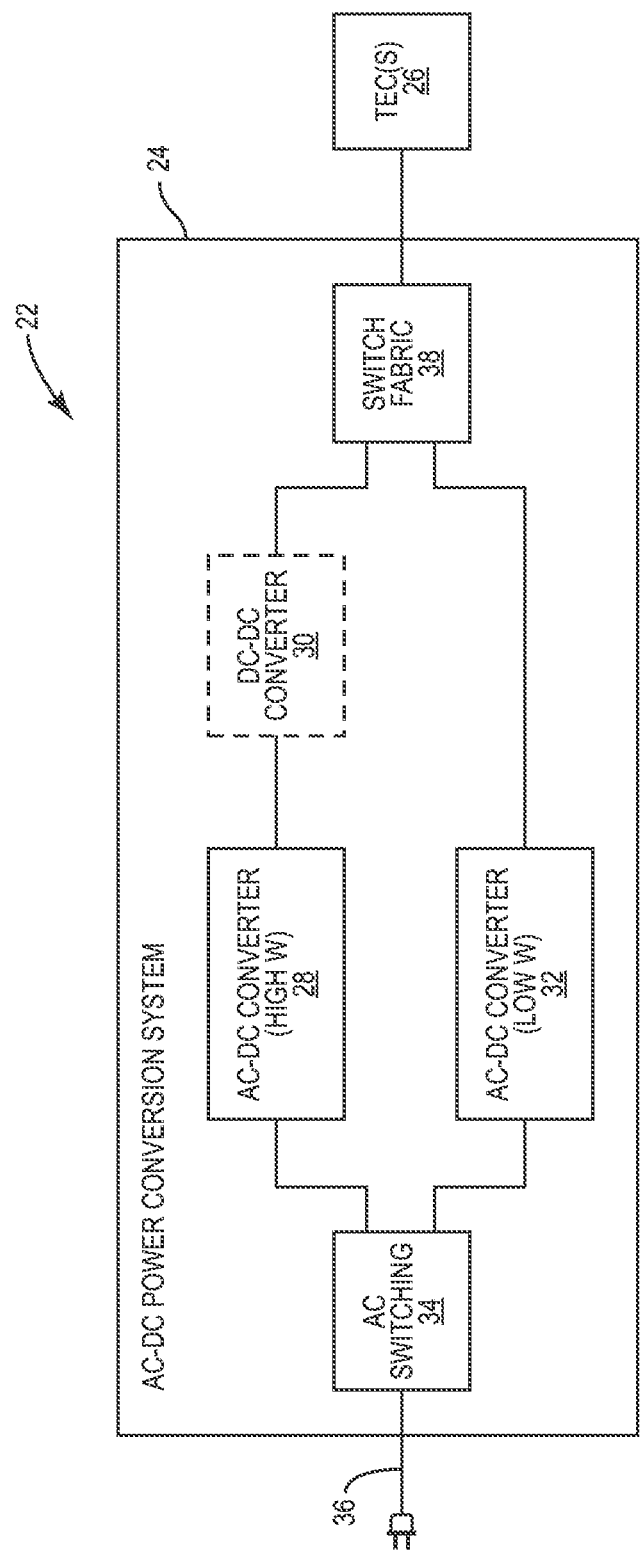
Figure 5:
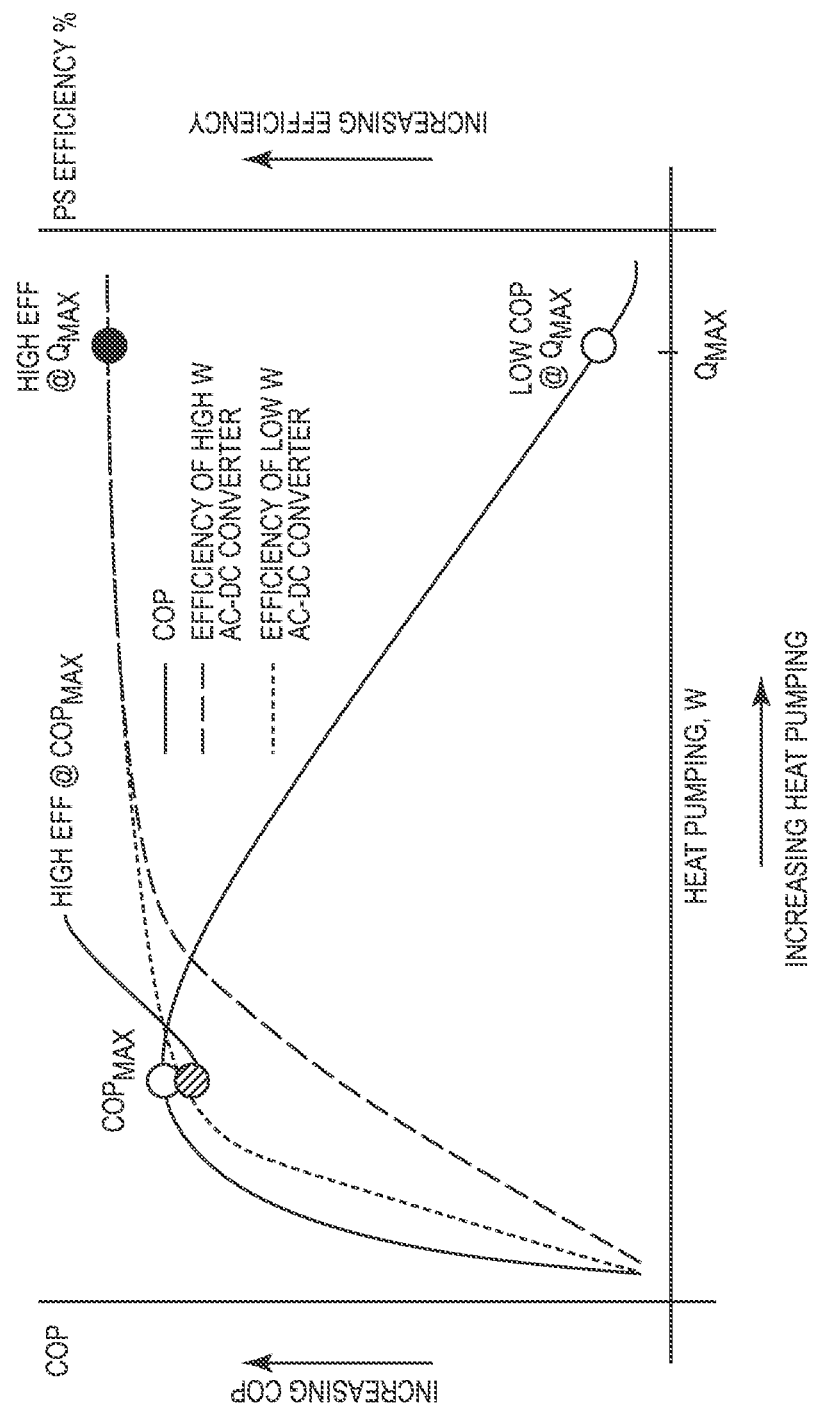
Figure 6:
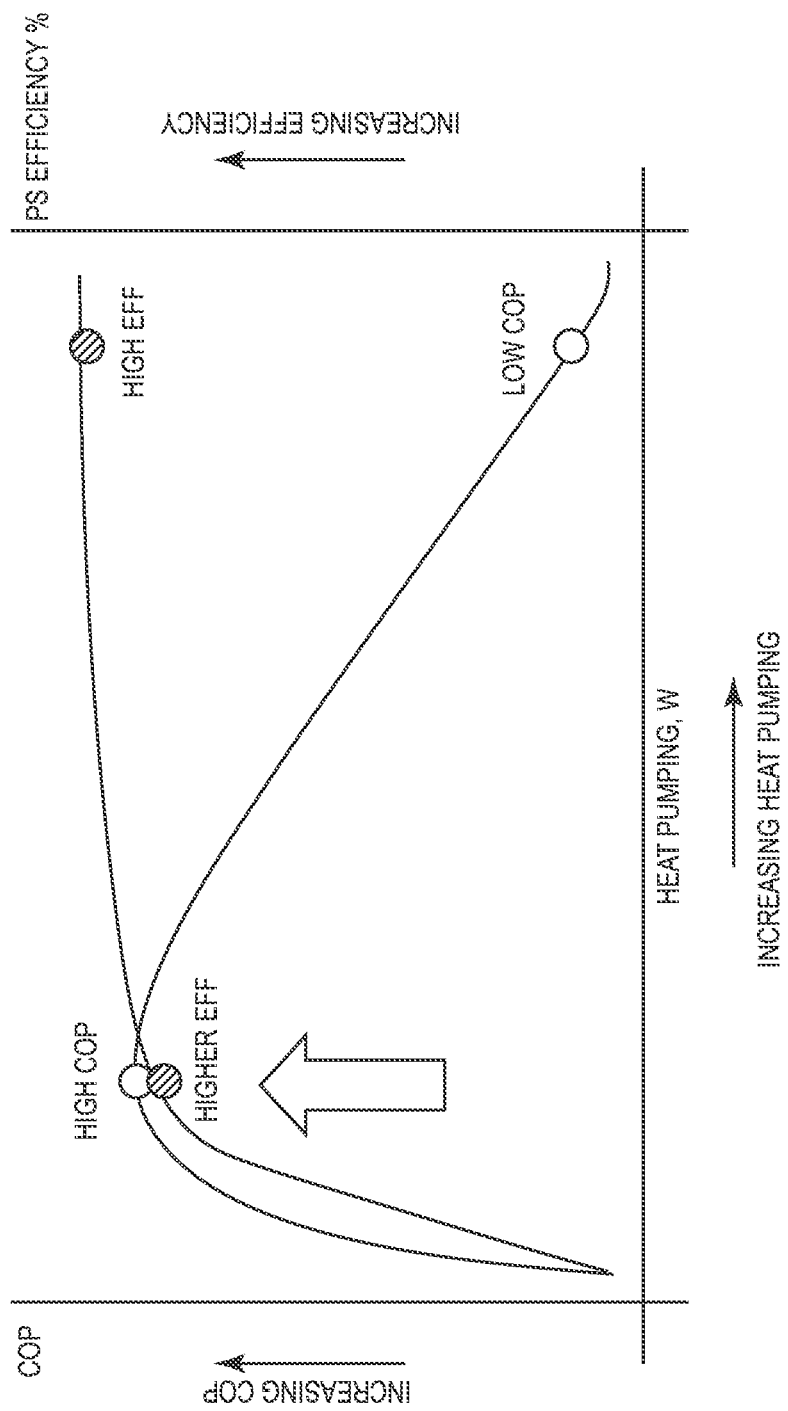
Figure 7:
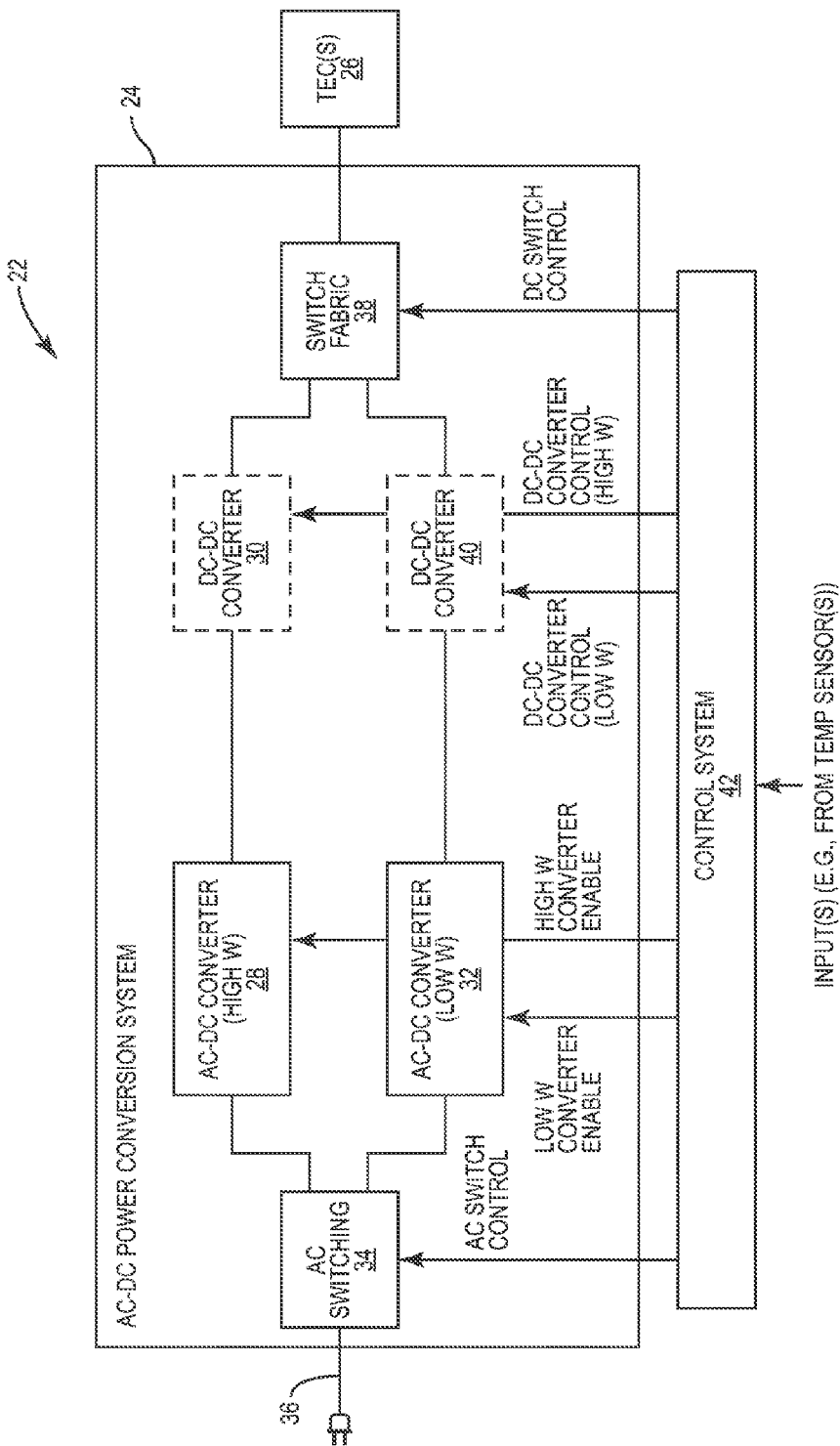
Figure 8:
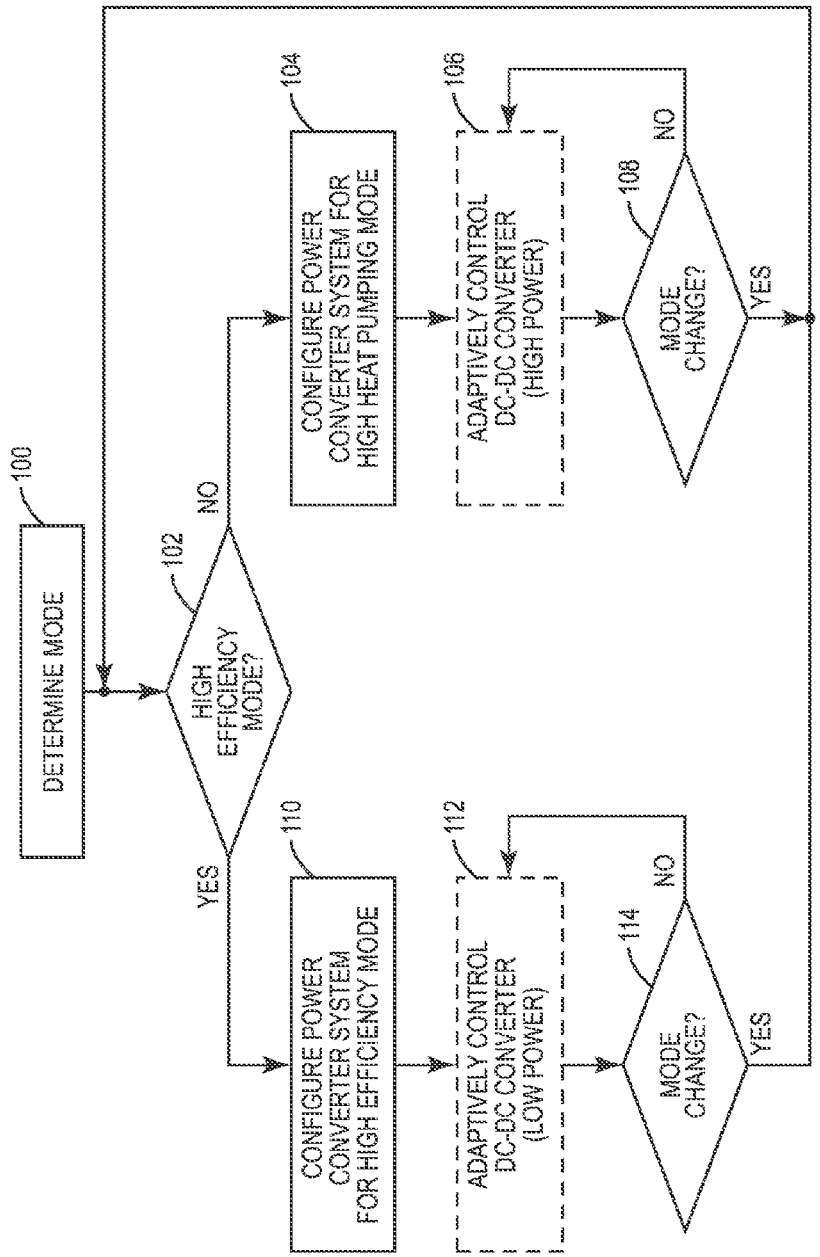
Figure 9:
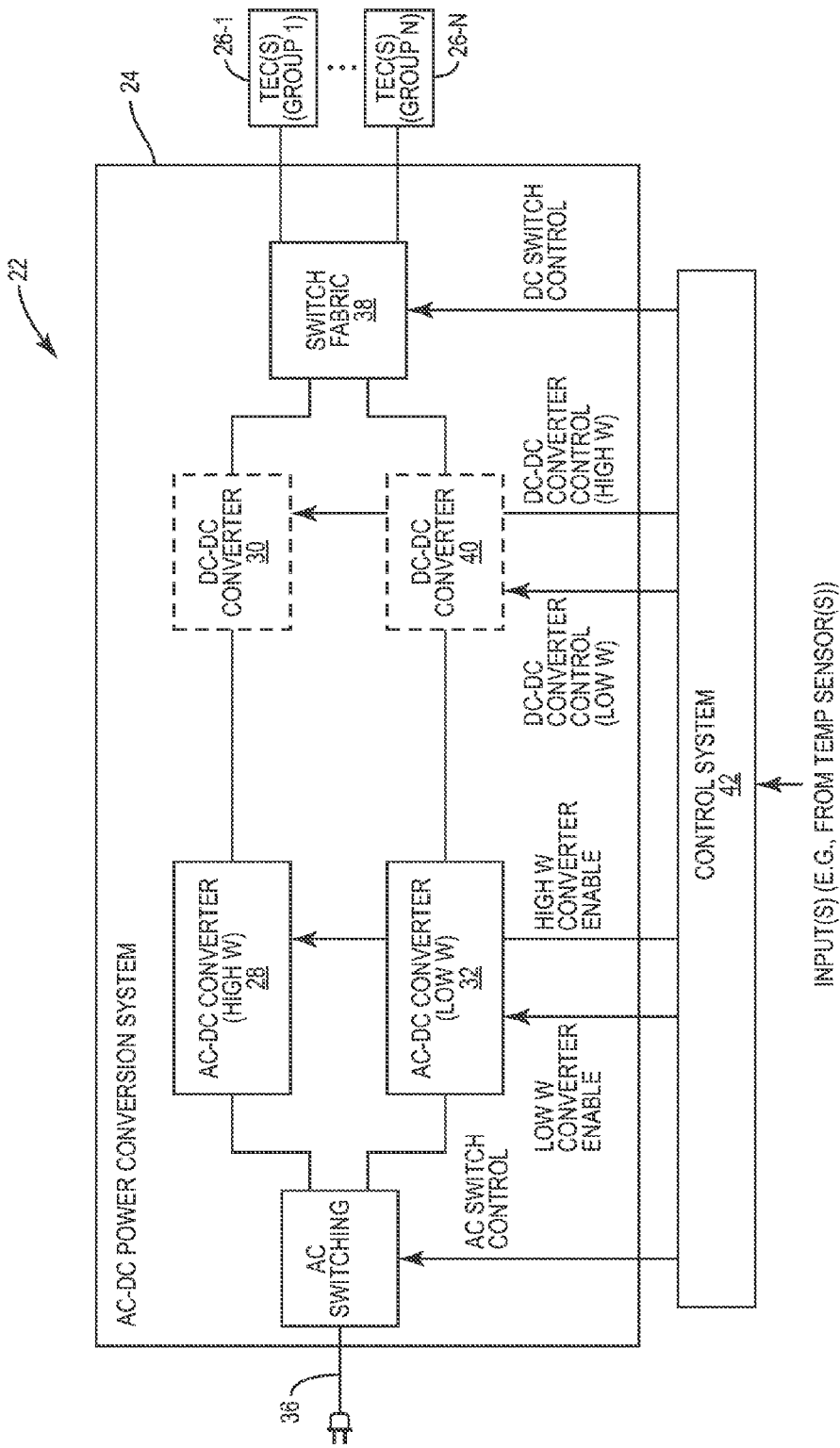

FIG. 4 is a block diagram of system including an AC-DC power conversion system and one or more TECs in which the AC-DC power conversion system includes a high power AC-DC converter for supplying power to the TEC(s) during a high heat pumping mode of operation and a low power AC-DC converter for supplying power to the TEC(s) during a high efficiency mode of operation according to some embodiments of the present disclosure;

FIG. 5 is a graph illustrating a COP curve for the TEC(s) of FIG. 4 as well as efficiency curves for the high power and low power AC-DC converters of the AC-DC power conversion system of FIG. 4 according to some embodiments of the present disclosure;

FIG. 6 is a graph illustrating a COP curve for the TEC(s) of FIG. 4 as well as an effective efficiency curve for the AC-DC power conversion system of FIG. 4 according to some embodiments of the present disclosure;

FIG. 7 is a block diagram of the system of FIG. 4 according to some other embodiments of the present disclosure;

FIG. 8 is a flow chart that illustrates the operation of the control system of FIG. 7 according to some embodiments of the present disclosure;

FIG. 9 is a block diagram of the system of FIG. 4 according to some other embodiments of the present disclosure; and FIG. 10 is a block diagram of a control system according to some embodiments of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the disclosure. As used herein, the singular forms "a," "an," and the are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Systems and methods are disclosed herein relating to an Alternating Current-Direct Current (AC-DC) power conversion system for supplying power to one or more Thermoelectric Coolers (TECs) in such a manner as to minimize or reduce total AC power draw. However, before describing these systems and methods, a discussion of a Coefficient of Performance (COP) of a TEC and an efficiency of a conventional AC-DC power converter is beneficial. The COP of a TEC is a measure of the efficiency of the TEC and is defined as:

$$COP=Q/P_{in}$$

where Q is heat pumped by the TEC and $P_{in}$ is the input power of the TEC. The COP of a TEC is generally low when the heat pumped, and thus input power, is high and is generally high when the heat pumped, and thus input power, is low.

Figure 1:
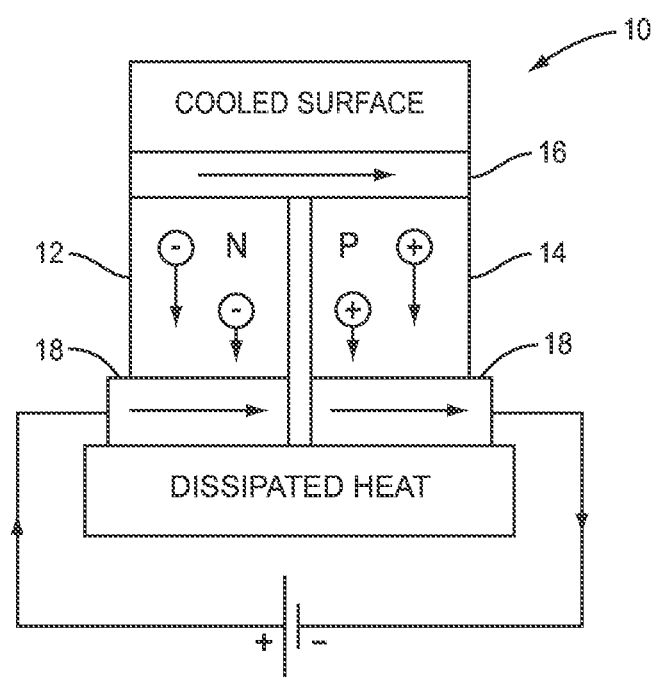
FIG. 1 illustrates a thermoelectric cooling device.
Figure 2:
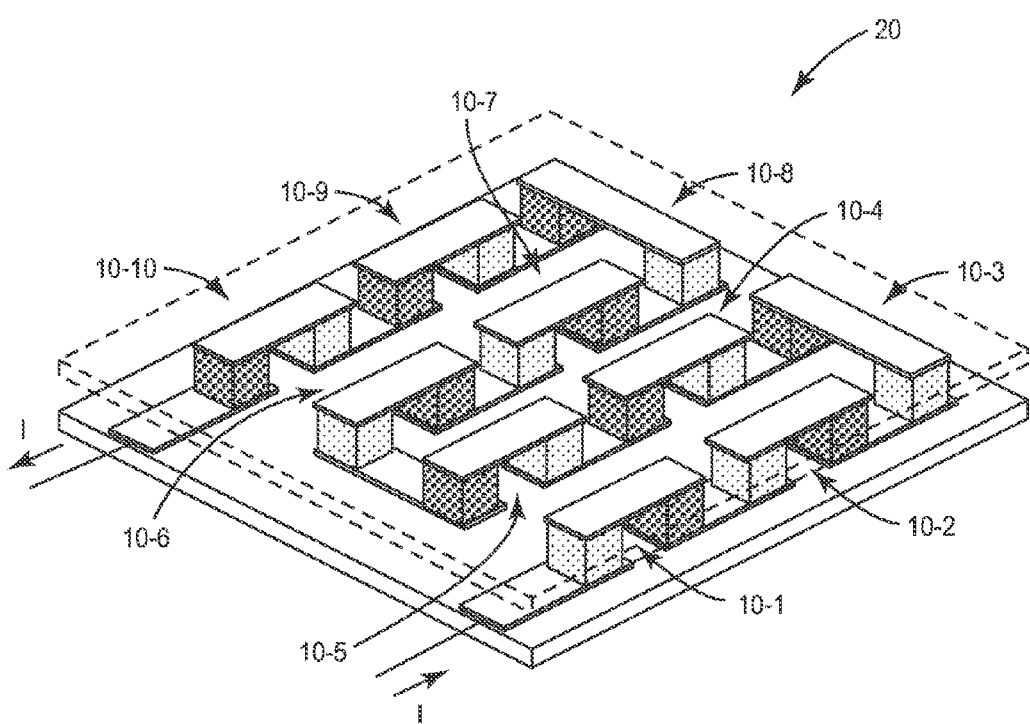
FIG. 2 illustrates a thermoelectric cooling module including multiple thermoelectric cooling devices.
Figure 3:
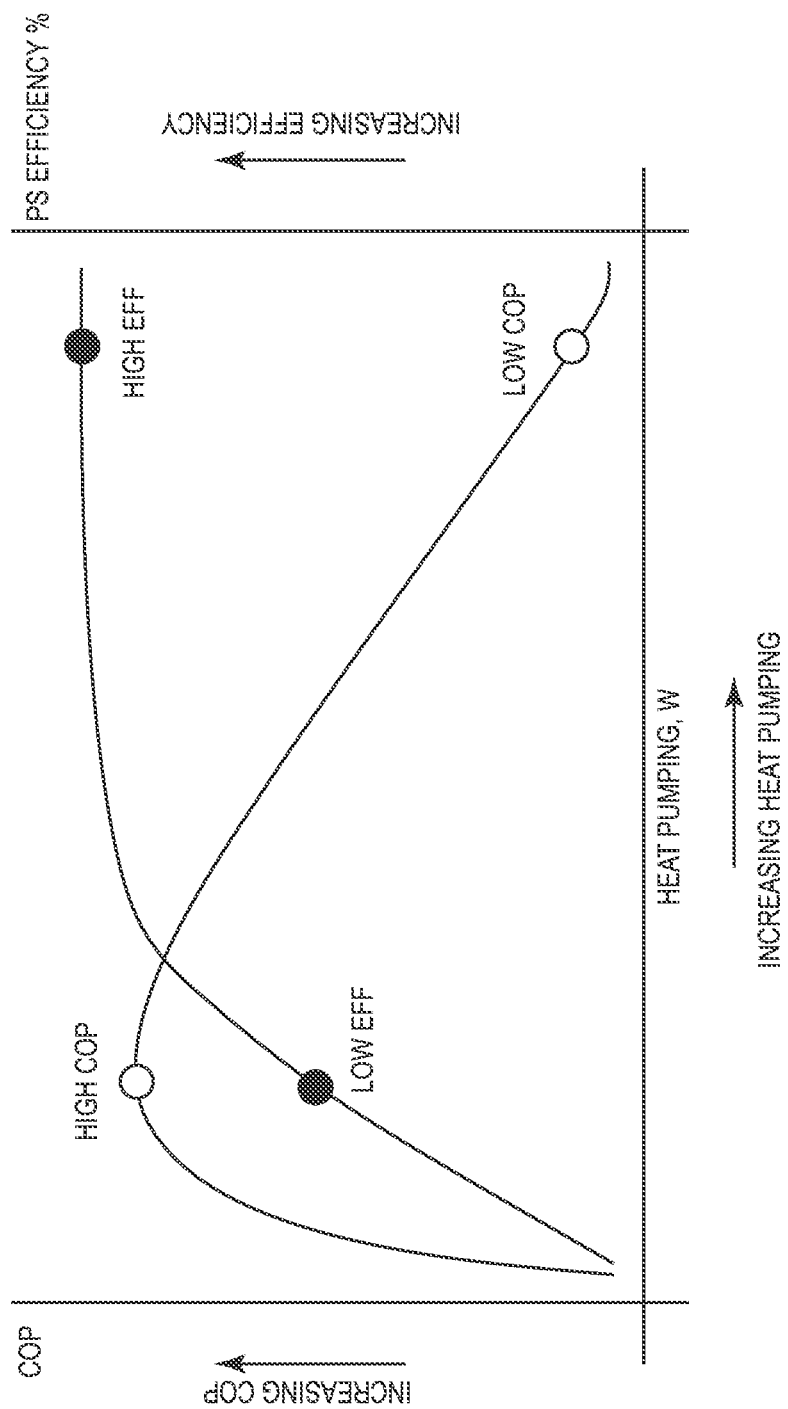
FIG. 3 is a graph illustrating a Coefficient of Performance (COP) curve for a Thermoelectric Cooler (TEC) and an efficiency curve for a conventional Alternating Current-Direct Current (AC-DC) power converter.

In contrast, the efficiency of conventional AC-DC power converters is generally high when the output power of the AC-DC power converter is high and low when then output power of the AC-DC power converter is low. As such, when a conventional AC-DC power converter is used to provide power to a TEC operating at low COP (high heat pumping energy), the AC-DC power converter performs with high efficiency. Conversely, when the AC-DC power converter is used to provide power to a TEC operating at high COP (low heat pumping energy), the AC-DC power converter performs with low efficiency. This presents a fundamental challenge in applications where total AC power draw is desired to be low since, in order to achieve satisfactory performance, operation of the TEC is desired to be controlled such that the TEC operates at both a high COP and a low COP (i.e., high heat pumping energy) under different conditions. For example, a TEC based refrigeration system may desire to operate the TEC at high COP most of the time (e.g., under steady state conditions) and infrequently operate the TEC at low COP (i.e., high heat pumping energy) (e.g., under pull-down or recovery conditions). As illustrated in FIG. 3, when the TEC is operated at high COP, the AC-DC power converter performs with low efficiency and, as such, the overall AC power draw is less than ideal. As also illustrated in FIG. 3, when the TEC is operated at low COP (i.e., high heat pumping energy), the AC-DC power converter performs with high efficiency, but the overall AC power draw is again less than ideal due to the low COP of the TEC.

In order to address this problem, an AC-DC power conversion system for supplying power to one or more TECs is disclosed herein that provides high efficiency both when operating the TEC(s) at high COP and when operating the TEC(s) at low COP (i.e., high heat pumping energy). In particular, the AC-DC power conversion system includes two AC-DC power conversion subsystems, one with high power capability and one with low power capability. A switch network, or switching fabric, connects the two separate AC-DC power conversion subsystems to the TEC(s). In some embodiments, a microcontroller intelligently controls the AC-DC power conversion subsystems and the switch network. The low power AC-DC power conversion subsystem is designed such that its power conversion efficiency is maximized when the TEC(s) operates at its high COP point (with lower heat pumping magnitude). The high power AC-DC power conversion subsystem is designed such that its power conversion efficiency is maximized when the TEC(s) operates at its low COP point (with high heat pumping magnitude).

FIG. 4 illustrates a system 22 including an AC-DC power conversion system 24 supplying power to one or more TECs 26 according to some embodiments of the present disclosure. The AC-DC power conversion system 24 includes a high power AC-DC power converter 28 and an optional DC-DC converter 30 forming a first power conversion subsystem and a low power AC-DC power converter 32 forming a second power conversion subsystem. An AC switching network 34 has an input coupled to an AC source (not shown), e.g., an AC outlet via a cable 36, a first output coupled to an input of the high power AC-DC power converter 28, and a second output coupled to an input of the low power AC-DC power converter 32. A switching fabric 38, or switch network, has a first input coupled to an output of the high power AC-DC power converter 28 (optionally via the DC-DC converter 30), a second input coupled to an output of the low power AC-DC power converter 32, and an output coupled to an input of the TEC(s) 26.

The high power AC-DC power converter 28 is designed for high power, or high Watt (W), operation, whereas the low power AC-DC power converter 32 is designed for low power, or low W, operation. More specifically, the high power AC-DC power converter 28 performs with maximum efficiency when the TEC(s) 26 operate at its (their) low COP operation point (e.g., maximum heat pumping ($Q_{max}$) operation point). Conversely, the low power AC-DC power converter 32 performs with maximum efficiency when the TEC(s) 26 operate at its (their) high COP (e.g., maximum COP operation point). This is illustrated in FIG. 5. As shown in the example of FIG. 5, the high power AC-DC power converter 28 performs with an efficiency that is approximately equal to a maximum efficiency of the high power AC-DC power converter 28 when providing a DC output at an output power level corresponding to the maximum heat pumping ($Q_{max}$) operation point of the TEC(s) 26. Conversely, the low power AC-DC power converter 32 performs with an efficiency that is approximately equal to a maximum efficiency of the low power AC-DC power converter 32 when providing a DC output at an output power level corresponding to the maximum COP ($COP_{max}$) operation point of the TEC(s) 26. As used herein, an efficiency that is "approximately equal to" the maximum efficiency is an efficiency that is at least 60% of the maximum efficiency in some embodiments and is at least 80% of the maximum efficiency in some other embodiments.

In operation, the TEC(s) 26 are operated either in a high efficiency mode of operation or a high heat pumping mode of operation. In the high heat pumping mode of operation, the switching fabric 38 is controlled to couple the output of the high power AC-DC power converter 28 to the input of the TEC(s) 26. The DC output of the high power AC-DC power converter 28 is provided at an output power level for the high heat pumping mode of operation of the TEC(s) 26. This output power level corresponds to a high heat pumping operation point (e.g., a maximum heat pumping ($Q_{max}$) operation point) of the TEC(s) 26. As used herein, a high heat pumping operation point is an operation point of the TEC(s) 26 where Q is greater than the heat pumping energy of the TEC(s) 26 when operating at $COP_{max}$ (i.e., greater than $Q_{COPmax}$) and the COP of the TEC(s) 26 is less than 80% of $COP_{max}$, or more preferably less than 70%, of $COP_{max}$, or more preferably less than 50% of $COP_{max}$, or more preferably less than 25% of $COP_{max}$. The high power AC-DC power converter 28 has, at the output power level for the high heat pumping mode of operation, an efficiency that is approximately equal to the maximum efficiency of the high power AC-DC power converter 28. Notably, when operating in the high heat pumping mode of operation, the DC-DC converter 30 may be controlled to adjust the power level provided to the TEC(s) 26 and thus the heat pumping energy of the TEC(s) 26.

In the high efficiency mode of operation, the switching fabric 38 is controlled to couple the output of the low power AC-DC power converter 32 to the input of the TEC(s) 26. The DC output of the low power AC-DC power converter 32 is provided at an output power level for the high efficiency mode of operation of the TEC(s) 26. This output power level corresponds to a high COP operation point (e.g., a maximum COP operation point) of the TEC(s) 26. As used herein, a high COP operation point is an operation point of the TEC(s) 26 where the COP of the TEC(s) 26 is approximately equal to $COP_{max}$. Here, a COP that is approximately equal to $COP_{max}$ is a COP that is at least 80% of $COP_{max}$, or more preferably at least 90% of $COP_{max}$, or even more preferably at least 95% of $COP_{max}$. The low power AC-DC power converter 32 has, at the output power level for the high efficiency mode of operation, an efficiency that is approximately equal to the maximum efficiency of the low power AC-DC power converter 32.

FIG. 6 illustrates one example of a COP curve for the TEC(s) 26 and an aggregate, or effective, efficiency curve of the AC-DC power conversion system 24 of FIG. 4. Unlike the conventional power converter (see FIG. 3), the AC-DC power conversion system 24 provides high efficiency both with operating the TEC(s) 26 at a high COP operation point and at a high heat pumping operation point. In this manner, total AC draw, or power consumption, for the AC-DC power conversion system 24 and the TEC(s) 26 is substantially reduced, particularly when operating the TEC(s) 26 at a high COP operation point, as compared to that achieved when using a conventional AC-DC power converter.

FIG. 7 illustrates the system 22 of FIG. 4 according to some embodiments of the present disclosure in which the system 22 further comprises an optional DC-DC converter 40 coupled to the output of the low power AC-DC power converter 32 and a control system 42 that operates to control the AC-DC power conversion system 24 to operate the TEC(s) 26 in the high efficiency mode of operation or the high heat pumping mode of operation based on, e.g., one or more inputs (e.g., from temperature sensors, etc.). As illustrated, in this example, the DC-DC converter 40, which is optional, may be used to adjust the output power level provided to the TEC(s) 26 when operating in the high efficiency mode of operation. The control system 42 may include, for example, one or more processors, or processing circuitry, such as, e.g., one or more microprocessors, one or more Field Programmable Gate Arrays (FPGAs), one or more Application Specific Integrated Circuits (ASICs), or the like.

FIG. 8 is a flow chart that illustrates the operation of the control system 42 of FIG. 7 according to some embodiments of the present disclosure. This process is described with respect to FIG. 7. As illustrated, the control system 42 determines a mode of operation in which the TEC(s) 26 is to be operated (step 100). The determination may be made based on one or more inputs such as, e.g., temperature input(s) from a temperature sensor(s). If the determined mode of operation for the TEC(s) 26 is the high heat pumping mode of operation (step 102; NO), the control system 42 configures the AC-DC power conversion system 24 for the high heat pumping mode of operation (step 104). In particular, the control system 42 enables the high power AC-DC power converter 28 via a high W converter enable signal and disables the low power AC-DC power converter 32 via a low W converter enable signal. In addition, the control system 42 controls the switching fabric 38 to couple the output of the high power AC-DC power converter 28 to the input of the TEC(s) 26 via a DC switch control signal and controls the AC switching network 34 to couple the AC source to the input of the high power AC-DC power converter 28. Optionally, the control system 42 adaptively controls the DC-DC converter 30 to adaptively adjust the output power provided to the TEC(s) 26 during the high heat pumping mode of operation (step 106). The DC-DC converter 30 may be used to adjust the output power level within a predetermined high power level range. In some embodiments, the high power level range is a range of power levels that corresponds to a range of heat pumping energies within or including 30% to 100% of the maximum heat pumping energy ($Q_{max}$) of the TEC(s) 26 (e.g., 30% to 100% of $Q_{max}$, 50% to 100% of $Q_{max}$, 75% to 100% of $Q_{max}$, 40% to 90% of $Q_{max}$, or the like). In other embodiments, the high power level range is a range of power levels in which, e.g., the high power AC-DC power converter 28 performs at approximately the maximum efficiency of the high power AC-DC power converter 28.

Notably, when operating in the high heat pumping mode of operation, in some embodiments, it may be desirable for some of the TECs 26 to be operated at one power level and for others of the TECs 26 to be operated at another power level. In this case, the AC-DC power conversion system 24 is operated such that the higher of these two power levels is input to the switching fabric 38. The switching fabric 38 is intelligently controlled to provide this higher power level to the appropriate TEC(s) 26. For the other TEC(s) 26 for which a lower power level is desired, the switching fabric 38 is intelligently controlled to use Pulse Width Modulation (PWM) or periodic on/off switching to covert the higher power level to the lower power level, which is then provided to the appropriate TEC(s) 26. In this manner, the switching fabric 38 is intelligently controlled through the use of PWM or periodic on/off switching to resolve the situation where one or more TECs 26 require different power levels independently but are coupled to only the high power AC-DC power converter 28.

When operating in the high heat pumping mode of operation, the control system 42 monitors for a mode change (i.e., monitors for one or more conditions that would trigger a switch to the high efficiency mode of operation according to, e.g., a predetermined mode control procedure) (step 108). If no mode change is detected, the control system 42 returns to step 106 and continues. If there is a mode change, the control system 42 returns to step 102 and continues.

Returning to step 102, if the determined mode of operation is the high efficiency mode of operation (step 102; YES), the control system 42 configures the AC-DC power conversion system 24 for the high efficiency mode of operation (step 110). In particular, in some embodiments, the control system 42 enables the low power AC-DC power converter 32 via the low W converter enable signal and disables the high power AC-DC power converter 28 via the high W converter enable signal. Notably, in other embodiments, the low power AC-DC power converter 32 is always enabled, and only the high power AC-DC power converter 28 is enabled/disabled depending on the mode of operation. In addition, for the high efficiency mode of operation, the control system 42 controls the switching fabric 38 to couple the output of the low power AC-DC power converter 32 to the input of the TEC(s) 26 via the DC switch control signal and controls the AC switching network 34 to couple the AC source to the input of the low power AC-DC power converter 32. Optionally, the control system 42 adaptively controls the DC-DC converter 40 to adaptively adjust the output power provided to the TEC(s) 26 during the high efficiency mode of operation (step 112). The DC-DC converter 40 may be used to adjust the output power level within a predetermined low power level range. In some embodiments, the low power level range is a range of output power levels in which, e.g., the TEC(s) 26 operates at approximately the maximum COP of the TEC(s) 26 (e.g., a range of output power levels corresponding to a range of COP values within or including 80% to 100% of $COP_{max}$ such as, for example, 80% to 100% of $COP_{max}$, 90% to 100% of $COP_{max}$, 82% to 98% of $COP_{max}$, or the like).

Notably, when operating in the high efficiency mode of operation, in some embodiments, it may be desirable for some of the TECs 26 to be operated at one power level and for others of the TECs 26 to be operated at another power level. In this case, the AC-DC power conversion system 24 is operated such that the higher of these two power levels is input to the switching fabric 38. The switching fabric 38 is intelligently controlled to provide this higher power level to the appropriate TEC(s) 26. For the other TEC(s) 26 for which a lower power level is desired, the switching fabric 38 is intelligently controlled to use PWM or periodic on/off switching to covert the higher power level to the lower power level, which is then provided to the appropriate TEC(s) 26. In this manner, the switching fabric 38 is intelligently controlled through the use of PWM or periodic on/off switching to resolve the situation where one or more TECs 26 require different power levels independently but are coupled to only the low power AC-DC power converter 32.

When operating in the high efficiency mode of operation, the control system 42 monitors for a mode change (i.e., monitors for one or more conditions that would trigger a switch to the high heat pumping mode of operation according to, e.g., a predetermined mode control procedure) (step 114). If no mode change is detected, the control system 42 returns to step 112 and continues. If there is a mode change, the control system 42 returns to step 102 and continues.

FIG. 9 illustrates the system 22 according to some other embodiments of the present disclosure. Here, the one or more TECs 26 include a number (N) of sets of TECs 26-1 through 26-N where each set includes one or more TECs. Further, the switching fabric 38 has a separate output for each of the sets of TECs 26-1 through 26-N such that the sets of TECs 26-1 through 26-N can be independently coupled to either the high power AC-DC power converter 28 or the low power AC-DC power converter 32. In other words, the sets of TECs 26-1 through 26-N are independently controlled to operate in either the high heat pumping mode of operation or the high efficiency mode of operation.

As an example, the set of TECs 26-1 may be operated in the high heat pumping mode of operation and the set of TECs 26-N may be operated in the high efficiency mode of operation. In order to do so, the control system 42 enables both the high power AC-DC power converter 28 and the low-power AC-DC power converter 32 and controls the switching fabric 38 to couple the output of the high power AC-DC power converter 28 to the input of the set of TECs 26-1 and to couple the output of the low power AC-DC power converter 32 to the input of the set of TECs 26-N.

FIG. 10 is a block diagram of the control system 42 according to some embodiments of the present disclosure. As illustrated, the control system 42 includes one or more processors 44 (e.g., one or more microprocessors, one or more FPGAs, one or more ASICs, or the like), memory 46, and one or more Input/Output (I/O) components 48 (e.g., an interface(s) for receiving temperature reading(s) from a temperature sensor(s)). In some embodiments, the functionality of the control system 42 described herein is implemented in software and stored in the memory 46 for execution by the one or more processors 44.

In some embodiments, a computer program including instructions which, when executed by at least one processor, causes the at least one processor to carry out the functionality of the control system 42 according to any one of the embodiments described herein is provided. In some embodiments, a carrier containing the aforementioned computer program product is provided. The carrier is one of an electronic signal, an optical signal, a radio signal, or a computer readable storage medium (e.g., a non-transitory computer readable medium such as the memory 38).

Those skilled in the art will recognize improvements and modifications to the preferred embodiments of the present disclosure. All such improvements and modifications are considered within the scope of the concepts disclosed herein and the claims that follow.

What is claimed is:

1. A system comprising:
   one or more Thermoelectric Coolers (TECs); and
   an Alternating Current-Direct Current (AC-DC) power conversion system configured to supply power to the one or more TECs for a high efficiency mode of operation and a high heat pumping mode of operation, the AC-DC power conversion system comprising:
      a first AC-DC power converter configured to convert an AC input to a DC output at a first output power level for the high efficiency mode of operation of the one or more TECs, the first output power level corresponding to a high Coefficient of Performance (COP) operation point of the one or more TECs and the first AC-DC power converter having, at the first output power level, an efficiency that is approximately equal to a maximum efficiency of the first AC-DC power converter; and a second AC-DC power converter configured to convert the AC input to a DC output at a second output power level for the high heat pumping mode of operation of the one or more TECs, the second output power level corresponding to a high heat pumping operation point of the one or more TECs and the second AC-DC power converter having, at the second output power level, an efficiency that is approximately equal to a maximum efficiency of the second AC-DC power converter;

wherein for the high efficiency mode of operation of the one or more TECs the first AC-DC power converter is enabled and the second AC-DC power converter is disabled.

2. The system of claim 1 wherein the AC-DC power conversion system further comprises a switching fabric comprising a first input coupled to an output of the first AC-DC power converter, a second input coupled to an output of the second AC-DC power converter, and an output coupled to the one or more TECs.

3. The system of claim 2 wherein the AC-DC power conversion system further comprises a DC-DC converter having an input coupled to an output of the second AC-DC power converter and an output coupled to the second input of the switching fabric.

4. The system of claim 3 further comprising a controller configured to adaptively control the DC-DC converter when operating the one or more TECs in the high heat pumping mode of operation to adaptively adjust a power level provided to the one or more TECs within a predetermined high power level range.

5. The system of claim 4 wherein the predetermined high power level range is a range of power levels that corresponds to a range of heat pumping energies within or including 30% to 100% of a maximum heat pumping ($Q_{max}$) of the one or more TECs.

6. The system of claim 2 wherein the AC-DC power conversion system further comprises a DC-DC converter having an input coupled to an output of the first AC-DC power converter and an output coupled to the first input of the switching fabric.

7. The system of claim 6 further comprising a controller configured to adaptively control the DC-DC converter when operating the one or more TECs in the high efficiency mode of operation to adaptively adjust a power level provided to the one or more TECs within a predetermined low power level range.

8. The system of claim 7 wherein the predetermined low power level range is a range of power levels that corresponds to a range of COP values within or including 80% to 100% of a maximum COP ($COP_{max}$) for the one or more TECs.

9. The system of claim 2 further comprising a controller configured to selectively control the switching fabric such that the one or more TECs are coupled to the output of first AC-DC power converter for the high efficiency mode of operation and coupled to the output of the second AC-DC power converter for the high heat pumping mode of operation.

10. The system of claim 9 wherein the controller is further configured to enable the first AC-DC power converter and disable the second AC-DC power converter for the high efficiency mode of operation of the one or more TECs.

11. The system of claim 10 wherein the controller is further configured to enable the second AC-DC power converter for the high heat pumping mode of operation of the one or more TECs.

12. The system of claim 1 wherein:
the one or more TECs comprise a first set of TECs and a second set of TECs, each of the first set and second set of TECs comprising one or more TECs; and
the AC-DC power conversion system further comprises a switching fabric comprising a first input coupled to an output of the first AC-DC power converter, a second input coupled to an output of the second AC-DC power converter, a first output coupled to the first set of TECs, and a second output coupled to the second set of TECs;
wherein the switching fabric is configured to independently couple the first and second sets of TECs to the first and second AC-DC power converters such that the first and second sets of TECs are independently operated in either the high efficiency mode of operation or the high heat pumping mode of operation.

13. The system of claim 1 wherein the high COP operation point is a maximum COP operation point and the high heat pumping operation point is a maximum heat pumping operation point.

14. A method controlling an Alternating Current-Direct Current (AC-DC) power conversion system to provide power to one or more Thermoelectric Coolers (TECs) for a high efficiency mode of operation and a high heat pumping mode of operation, the AC-DC power conversion system comprising a first AC-DC power converter configured to convert an AC input to a DC output at a first output power level for the high efficiency mode of operation of the one or more TECs and a second AC-DC power converter configured to convert the AC input to a DC output at a second output power level for the high heat pumping mode of operation of the one or more TECs, the method comprising:
determining whether to operate the one or more TECs in the high efficiency mode of operation or the high heat pumping mode of operation;
upon determining to operate the one or more TECs in the high efficiency mode of operation, configuring the AC-DC power conversion system to couple an output of the first AC-DC power converter to the one or more TECs, the first output power level of the DC output of the first AC-DC power converter corresponding to a high Coefficient of Performance (COP) operation point of the one or more TECs and the first AC-DC power converter having, at the first output power level, an efficiency that is approximately equal to a maximum efficiency of the first AC-DC power converter and the second AC-DC power converter is disabled; and
upon determining to operate the one or more TECs in the high heat pumping mode of operation, configuring the AC-DC power conversion system to couple an output of the second AC-DC power converter to the one or more TECs, the second output power level of the DC output of the second AC-DC power converter corresponding to a high heat pumping operation point of the one or more TECs and the second AC-DC power converter having, at the second output power level, an efficiency that is approximately equal to a maximum efficiency of the second AC-DC power converter.

15. The method of claim 14 wherein the AC-DC power conversion system further comprises a switching fabric comprising a first input coupled to the output of the first AC-DC power converter, a second input coupled to the output of the second AC-DC power converter, and an output coupled to the one or more TECs, and:
- configuring the AC-DC power conversion system to couple the output of the first AC-DC power converter to the one or more TECs comprises configuring the switching fabric to couple the first input of the switching fabric to the output of the switching fabric; and
- configuring the AC-DC power conversion system to couple the output of the second AC-DC power converter to the one or more TECs comprises configuring the switching fabric to couple the second input of the switching fabric to the output of the switching fabric.

16. The method of claim 14 wherein the AC-DC power conversion system further comprises a switching fabric comprising a first input coupled to the output of the first AC-DC power converter, a second input coupled to the output of the second AC-DC power converter, a first output coupled to a first subset of the one or more TECs, and a second output coupled to a second subset of the one or more TECs, and:
- configuring the AC-DC power conversion system to couple the output of the first AC-DC power converter to the one or more TECs comprises:
  - configuring the switching fabric to couple the first input of the switching fabric to the first output of the switching fabric and the second output of the switching fabric; and
  - utilizing pulse width modulation or on/off switching to provide an output power level at the second output of the switching fabric that is less than an output power level at the first output of the switching fabric.

17. The method of claim 14 wherein the AC-DC power conversion system further comprises a switching fabric comprising a first input coupled to the output of the first AC-DC power converter, a second input coupled to the output of the second AC-DC power converter, a first output coupled to a first subset of the one or more TECs, and a second output coupled to a second subset of the one or more TECs, and:
- configuring the AC-DC power conversion system to couple the output of the second AC-DC power converter to the one or more TECs comprises:
  - configuring the switching fabric to couple the second input of the switching fabric to the first output of the switching fabric and the second output of the switching fabric; and
  - utilizing pulse width modulation or on/off switching to provide an output power level at the second output of the switching fabric that is less than an output power level at the first output of the switching fabric.

18. The method of claim 15 wherein the AC-DC power conversion system further comprises a DC-DC converter having an input coupled to the output of the second AC-DC power converter and an output coupled to the second input of the switching fabric, and the method further comprises, upon determining to operate the one or more TECs in the high heat pumping mode of operation, adaptively controlling the DC-DC converter when operating the one or more TECs in the high heat pumping mode of operation to adaptively adjust a power level provided to the one or more TECs within a predetermined high power level range.

19. The method of claim 18 wherein the predetermined high power level range is a range of power levels that corresponds to a range of heat pumping energies within or including 30% to 100% of a maximum heat pumping ($Q_{max}$) of the one or more TECs.

20. The method of claim 15 wherein the AC-DC power conversion system further comprises a DC-DC converter having an input coupled to the output of the first AC-DC power converter and an output coupled to the first input of the switching fabric, and the method further comprises, upon determining to operate the one or more TECs in the high efficiency mode of operation, adaptively controlling the DC-DC converter when operating the one or more TECs in the high efficiency mode of operation to adaptively adjust a power level provided to the one or more TECs within a predetermined low power level range.

21. The method of claim 20 wherein the predetermined low power level range is a range of power levels that corresponds to a range of COP values within or including 80% to 100% of a maximum COP ($COP_{max}$) for the one or more TECs plus or minus 10%.

22. The method of claim 14 further comprising, upon determining to operate the one or more TECs in the high heat pumping mode of operation, enabling the second AC-DC power converter.

23. The method of claim 14 wherein the high COP operation point is a maximum COP operation point and the high heat pumping operation point is a maximum heat pumping operation point.

* * * * *